United States Patent
Toyoda

(10) Patent No.: US 6,605,861 B2
(45) Date of Patent: Aug. 12, 2003

(54) SEMICONDUCTOR DEVICE

(75) Inventor: Yoshihiko Toyoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/895,071

(22) Filed: Jul. 2, 2001

(65) Prior Publication Data

US 2002/0130394 A1 Sep. 19, 2002

(30) Foreign Application Priority Data

Jan. 17, 2001 (JP) .................................... 2001-008725

(51) Int. Cl.⁷ .............................................. H01L 23/544
(52) U.S. Cl. ........................................ 257/620; 257/762
(58) Field of Search ................................. 257/620, 762

(56) References Cited

U.S. PATENT DOCUMENTS

| | | | |
|---|---|---|---|
| 5,059,899 A | | 10/1991 | Farnworth et al. |
| 6,313,024 B1 | * | 11/2001 | Cave et al. .................. 438/598 |
| 6,365,958 B1 | * | 4/2002 | Ibnabdeljalil et al. ........ 257/620 |

FOREIGN PATENT DOCUMENTS

| | | |
|---|---|---|
| JP | 8-139087 | 5/1996 |
| JP | 8-162456 | 6/1996 |

OTHER PUBLICATIONS

Contolini et al., "A Copper Via Plug Process By Electrochemical Planarization", VMIC Conference, Jun. 1993, pp. 470–477.

"IBM's Impact On Development Of Cu Plating Started Last Apr. In Japan, Aspect Ratio Matters In Electro–process, Controllability/EM Immunity Matters In Electroless–process", Dec. 1997, pp. 107–111.

* cited by examiner

Primary Examiner—Jerome Jackson
(74) Attorney, Agent, or Firm—Leydig, Voit & Mayer, Ltd.

(57) ABSTRACT

Chip element formation areas and scribe line areas dividing the chip formation areas are formed on a wafer. On each scribe line area, an interconnection surrounds each chip formation area, and extends to near an edge of a wafer. With this arrangement, it is possible to provide a semiconductor device and a manufacturing method which can reduce a difference in the depositing rate of plating between the center and the periphery of the wafer.

10 Claims, 12 Drawing Sheets

SEMICONDUCTOR DEVICE

BACKGROUND OF THE INVENTION

1. Field of the Invention

The present invention relates to a semiconductor device and a manufacturing method thereof, and more specifically to, for example, a structure of a scribe line area in an integrated circuit and a manufacturing method thereof.

2. Description of the Background Art

FIGS. 23 to 26 are schematic cross-sectional views that show a sequence of processes of a manufacturing method of a conventional semiconductor device, for example, described on page 107 in "Monthly Semiconductor World", December Issue, 1997. Referring to FIG. 23, a resist pattern 120 is formed on an insulating film 102 by a photolithographic technique. This insulating film 102 is subjected to a reactive ion etching process by using this resist pattern 120 as a mask. Thus, a groove 102a is formed on the insulating film 102. Thereafter, the resist pattern 120 is removed by ashing and a chemical treatment.

Referring to FIG. 24, a TaN film is formed on the insulating film 102 having a groove 102a as a barrier metal 114 with a thickness of 50 nm, and a Cu film is further formed thereon with a thickness of 150 nm as a seed layer 112a for a plated film.

Referring to FIG. 25, in a plating liquid of a copper sulfate bath, an electrolytic plating process is carried out so that the groove 102a is filled with the Cu film 112. Thereafter, the Cu film 112 and the barrier metal 111 are abraded and removed by a chemical and mechanical polishing method (CMP method), until at least the upper surface of the insulating film 102 has been exposed.

Referring to FIG. 26, by this CMP method, the Cu film 112 and the barrier metal 111 remain only in the groove 102a to form wiring.

FIG. 27 is a schematic cross-sectional view that shows the structure of an electrolytic plating device, for example, shown on page 470 of "Proc. Of 1993 VLSI Multilevel Interconnection Conference". Referring to FIG. 27, the electrolytic plating is carried out by applying a voltage between an anode 132 and a wafer 110 that are placed in an electrolytic solution 135 in a plating vessel 133; thus, a Cu film is deposited on the wafer 110 side. Here, the electrolytic solution 135 is introduced into the plating vessel 133 from an electrolytic solution inlet 134, and discharged from an electrolytic solution outlet 136.

On the wafer 110, the barrier metal 111 and the seed layer 112a have been formed on the insulating film 102, and the plated Cu film is deposited on the seed layer 112a. Here, the insulating film 102 is formed on, for example, a semiconductor substrate 103.

Moreover, the voltage to be applied to the wafer 110 is supplied to the barrier metal 111 and the seed layer 112a on the surface of the wafer 110 through a contact electrode 131. At this time, the deposition of the plating film preferentially takes place in the groove and on the bottom of the hole because of the effects of an additive agent added to the electrolytic solution 135 so that it is possible to obtain a superior filling property. Since such a phenomenon continues even after the groove and the hole have been filled, as the plating time becomes longer, the plated film tends to form a rise at the portions of the groove and the hole.

As described above, since the film deposition preferentially takes place in the groove and on the bottom of the hole in the electrolytic plating, the plated film tends to form a rise at the portions of the groove and the hole as the plating proceeds. Such a rise is high on the periphery of the wafer 110, and low in the center portion. The reason for this phenomenon is explained as follows:

In the electrolytic plating, a voltage is applied between the wafer 110 and the anode 132 so that a plating film is deposited on the seed layer 112a. The peripheral portion of the wafer 110 is in contact with the contact electrode 131 with the voltage being applied thereto.

Here, the thickness of the barrier metal 111 and the seed layer 112a is extremely thin and has very high resistance, with the result that the seed layer 112a comes to have an electric potential distribution in accordance with the distance from the contact electrode 131.

As described above, the deposition rate is higher on the peripheral portion of the wafer 110 close to the contact than that in the center portion at the initial stage of plating. Such a difference in the deposition rate is great in the case when the thickness of the plated Cu film formed on the wafer 110 is small. In other words, the difference in the deposition rate is the greatest at the initial stage of plating, and becomes smaller as the thickness of the plated film becomes greater.

In the case when the Cu film is removed by the CMP method, the abrasion time is set so as to remove the peripheral raised portion, with the result that the groove in the center portion and the hole portion tend to be excessively abraded, causing a problem in that a concave dent is formed on the surface of the Cu film (that is, on the surface of the wiring). The resulting problems are that there is an increase in the wiring resistance and that there are great deviations in the wiring resistance.

Moreover, when such a concave dent is formed on the wiring surface, metal tends to remain in a concave section on a upper wiring layer formed thereon, resulting in a problem of short-circuiting in the wiring.

SUMMARY OF THE INVENTION

An object of the present invention is to provide a semiconductor device and a manufacturing method thereof, which can reduce a difference in the deposition rate of plating between the center portion and the peripheral portion on a substrate.

A semiconductor device in accordance with one aspect of the present invention is provided with a plurality of chip-use element formation areas, each having a conductive layer formed by a plating method, a scribe line areas for dividing the plurality of chip-use element formation areas, and an interconnections being formed in the scribe line area and extended to the vicinity of an end edge of a wafer.

In the semiconductor device in accordance with this aspect of the present invention, the interconnection is formed from the vicinity of end edge of the wafer to which a contact electrode for supplying a voltage to the wafer at the time of plating is connected, to the inside of the scribe line area. The formation of the interconnection in this type makes it possible to reduce the resistance in comparison with a case in which only a thin seed layer and a barrier metal are formed; therefore, it becomes possible to reduce a difference in the electric potential between the center portion of the wafer and the peripheral portion thereof to which the contact electrode is connected. Consequently, the difference in the plating rate between the center portion and the peripheral portion of the wafer at the initial stage of plating, thereby enabling to reduce the occurrence of a dent on the surface of the upper-layer interconnection after the CMP process.

In the above-mentioned aspect, more preferably, the interconnection is formed in a manner so as to extend from side of a first chip-use element formation area to side of a second chip-use element formation area.

In this manner, each interconnection is extended laterally through the scribe line area located beside each chip-use element formation area so that the resistance reducing effect is further improved.

In the above-mentioned aspect, more preferably, the interconnection is allowed to surround the chip-use element formation area.

In this manner, the interconnection is extended and located in a manner so as to surround the periphery of each chip-use element formation area so that the resistance reducing effect is further improved.

In the above-mentioned aspect, more preferably, a test element for testing the characteristics of the element within the chip-use element formation area is further provided, and the test element is placed on the scribe line area.

In this manner, the present invention is also applied to a semiconductor device having a test element.

In the above-mentioned aspect, more preferably, the interconnection is formed so as to have a width greater than a width of cut margin of the scribe.

By increasing the width of the interconnection in this manner, the resistance reducing effect is further improved.

In the above-mentioned aspect, more preferably, a plurality of interconnections are formed, and the plurality of interconnections are laminated in the thickness direction, and electrically connected to one another.

By laminating the interconnections in this manner, the resistance reducing effect can be further improved.

In the above-mentioned aspect, more preferably, a semiconductor substrate having a main surface and an doping area formed in the scribe line area of the main surface of the semiconductor substrate are further provided, and the interconnection is electrically connected to the doping area.

By connecting the interconnection to the doping area, the resistance reducing effect can be further improved.

A semiconductor device in accordance with another aspect of the present invention is provided with a chip-use element formation area having a conductive layer formed by a plating method, a scribe line area formed in a manner so as to surround the chip-use element formation area and a interconnection that is formed in the scribe line area surrounding the chip-use element formation area, and reaches the end edge of the semiconductor chip.

In the semiconductor device in accordance with the above-mentioned aspect of the present invention, since the interconnection is formed in the scribe line area, it is possible to reduce the occurrence of a dent on the upper-layer interconnection surface after the CMP process, in the same manner as the aforementioned aspect. Moreover, since the interconnection is allowed to surround the chip-use element formation area, the resistance reducing effect can be further improved.

In the above-mentioned aspect, more preferably, a test element for testing the characteristics of the element within the chip-use element formation area is further provided, and the test element is placed on the scribe line area.

In this manner, the present invention is also applied to a semiconductor device having a test element.

In the above-mentioned aspect, more preferably, a plurality of interconnections are formed, and the plurality of interconnections are laminated in the thickness direction, and electrically connected to one another.

By laminating the interconnections in this manner, the resistance reducing effect can be further improved.

In the above-mentioned aspect, more preferably, a semiconductor substrate having a main surface and an doping area formed in the scribe line area of the main surface of the semiconductor substrate are further provided, and the interconnection is electrically connected to the doping area.

By connecting the interconnection to the doping area, the resistance reducing effect can be further improved.

According to the present invention, there is provided a manufacturing method of a semiconductor device having a plurality of chip-use element formation areas and scribe line areas for dividing the plurality of chip-use element formation areas respectively, comprising the following steps:

First, a interconnection is formed in a manner so as to extend through the scribe line area from the vicinity of the end edge of the wafer. Then, a plating seed layer is formed on the surface of the wafer so as to contact with the interconnection. A plating process is carried out while applying a voltage from a plating electrode to the plating seed layer and the interconnection so that a plated film is formed on the plating seed layer.

In accordance with the manufacturing method of a semiconductor device of the present invention, the interconnection is formed within the scribe line area from the vicinity of the end edge of the wafer to which the contact electrode for supplying a voltage to the wafer at the time of plating is connected. The formation of the interconnection of this type enables to reduce the resistance in comparison with a case in which only a thin seed layer and a barrier metal are formed; therefore, it becomes possible to reduce a difference in the electric potential between the center portion of the wafer and the peripheral portion thereof to which the contact electrode is connected. Consequently, it is possible to reduce the difference in the plating rate between the center portion and the peripheral portion of the wafer at the initial stage of plating, thereby enabling to reduce the occurrence of a dent on the surface of the upper-layer interconnection after the CMP process.

In the above-mentioned manufacturing method of a semiconductor device, more preferably, the process for forming the interconnection, the process for forming the plating seed layer and the process for forming the plated film are repeated so that a plurality of interconnections are laminated within the scribe line area.

By laminating the interconnections in this manner, the resistance reducing effect can be further improved.

The above-mentioned manufacturing method of a semiconductor device is more preferably provided with a process for forming an doping area in the scribe line area at the main surface of a semiconductor substrate, and the interconnection is electrically connected to the doping area.

By connecting the interconnection to the doping area, the resistance reducing effect can be further improved.

In the above-mentioned manufacturing method of a semiconductor device, more preferably, the doping area is formed by an ion injection process simultaneously as an element-use doping area is formed within the chip-use element formation area.

Consequently, it becomes possible to simplify the manufacturing process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to Figures, the following description will discuss preferred embodiments of the present invention.

(First Embodiment)

Figure 1:
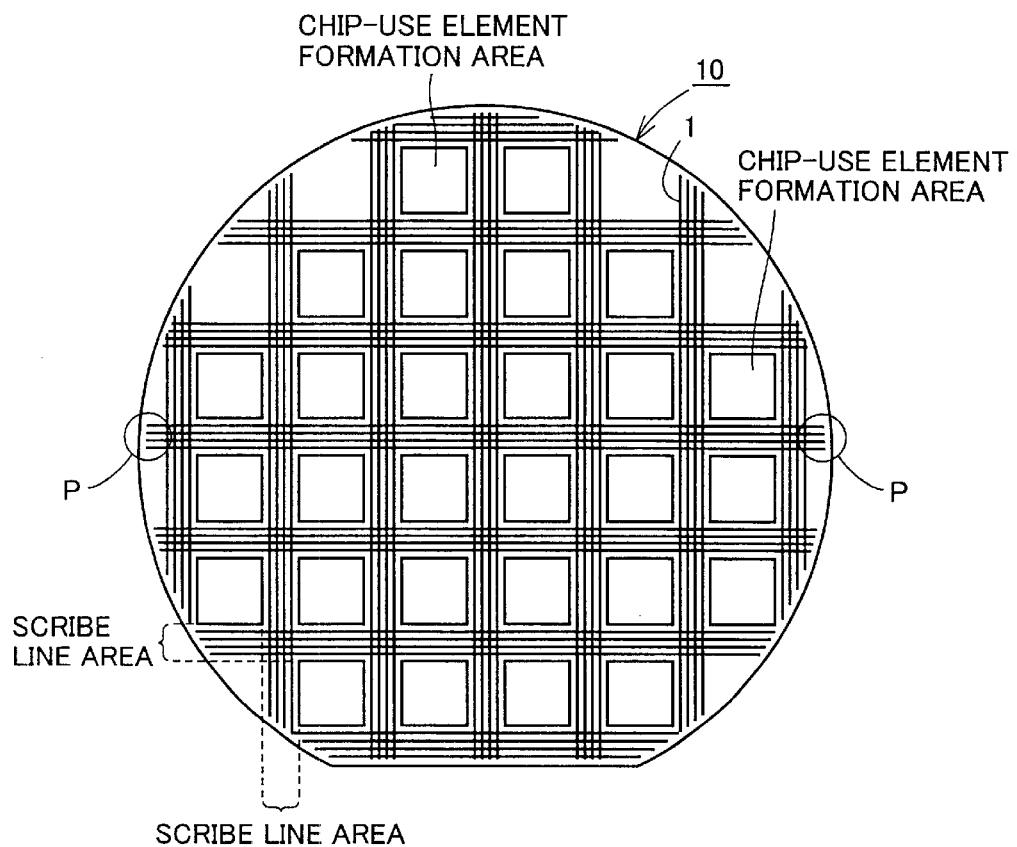
FIG. 1 is a schematic plan view that shows a structure of a semiconductor device in accordance with a first embodiment of the present invention.

Referring to FIG. 1, in the present embodiment, a wafer 10 is provided with a plurality of chip-use element formation areas, and scribe line areas that divide the plurality of chip-use element formation areas. A interconnection 1 is formed so as to be extended through the inside of each scribe line area to reach the vicinity of an end edge of the wafer 10 (for example, area P). This area P, which is located outside any of the chip-use element formation areas that are placed in the wafer 10, corresponds to a position to which a contact electrode is connected at the time of electrolytic plating.

Figure 2:
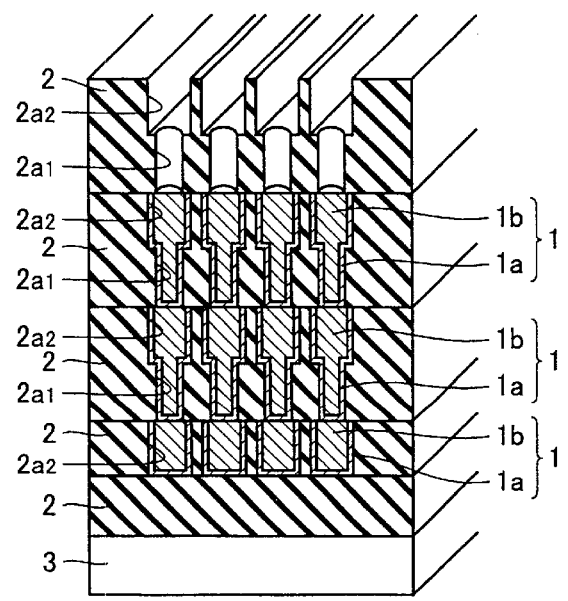
FIG. 2 is a perspective cross-sectional view that schematically shows a structure of a scribe section of the semiconductor device in accordance with the first embodiment of the present invention.

Referring to FIG. 2, in the scribe line area, insulating films 2, constituted by a plurality of layers, are laminated on the surface of a semiconductor substrate 3. On each insulating film 2, a wiring groove $2a_2$ is formed, and a interconnection 1 is filled in into the wiring groove $2a_2$. This interconnection 1 is constituted by a barrier metal 1a made of, for example, a TaN film, and a Cu film 1b formed by plating. Moreover, each interconnection 1 laminated in the thickness direction is electrically connected each other through a connection hole $2a_1$ formed in the insulating film 2.

Here, in FIG. 2, the connection hole $2a_1$ and the interconnection in the wiring groove $2a$ of the top layer of the insulating film 2 are omitted so as to clearly show the shapes of the connection hole $2a_1$ and the wiring groove $2a_2$.

Here, the size of each chip-use element formation area is, for example, 1 cm×1 cm, and the width of each scribe line area is, for example, 500 μm. Moreover, the width of each interconnection 1 is, for example, 0.4 μm, the interval between the interconnections 1 is 0.4 μm, and the depth of the interconnection 1 is, for example, 0.8 μm. Furthermore, the aperture diameter of the connection hole $2a_1$ is, for example, 0.3 μm, the depth is, for example, 0.6 μm, and the interval of the respective connection holes $2a_1$ in the interconnection direction is, for example, 0.7 μm.

Figure 3:
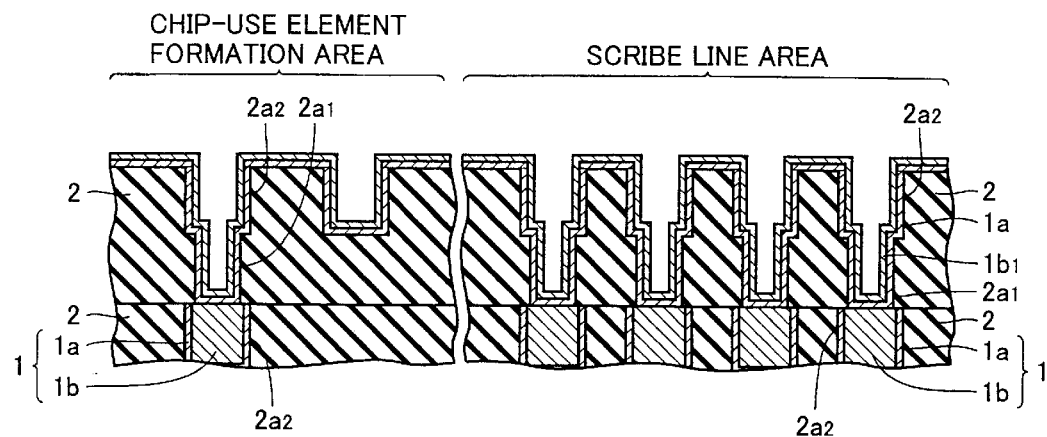
FIGS. 3, 4, and 5 are schematic cross-sectional views that show a sequence of processes of a manufacturing method of the semiconductor device in accordance with the first embodiment of the present invention.

Next, an explanation will be given of a manufacturing method of the present embodiment. Referring to FIG. 3, a lower-layer insulating film 2 is formed on a semiconductor substrate, not shown, and a wiring groove $2a_2$ is formed on this lower-layer insulating film 2. A lower-layer interconnection 1, constituted by a barrier metal 1a and a Cu film 1b, is formed on each of the chip-use element formation area and a scribe line area so as to be filled in into the wiring groove $2a_2$.

Here, a connection hole may be formed in the lower-layer insulating film 2, if necessary.

An upper-layer insulating film 2 is formed on the lower-layer insulating film 2. On this upper-layer insulating film 2, a connection hole $2a_1$ and a wiring groove $2a_2$ are respectively formed in the chip-use element formation area and the scribe line area by using a normal photolithographic technique and etching technique.

On the surface of the upper-layer insulating film 2 on which the connection hole $2a_1$ and a wiring groove $2a_2$ are formed, for example, a TaN film is formed with a thickness of 50 nm as a barrier metal 1a by sputtering and, for example, a Cu film is formed on this with a thickness of 150 nm as a seed layer $1b_1$ for a plating film by sputtering.

Figure 4:
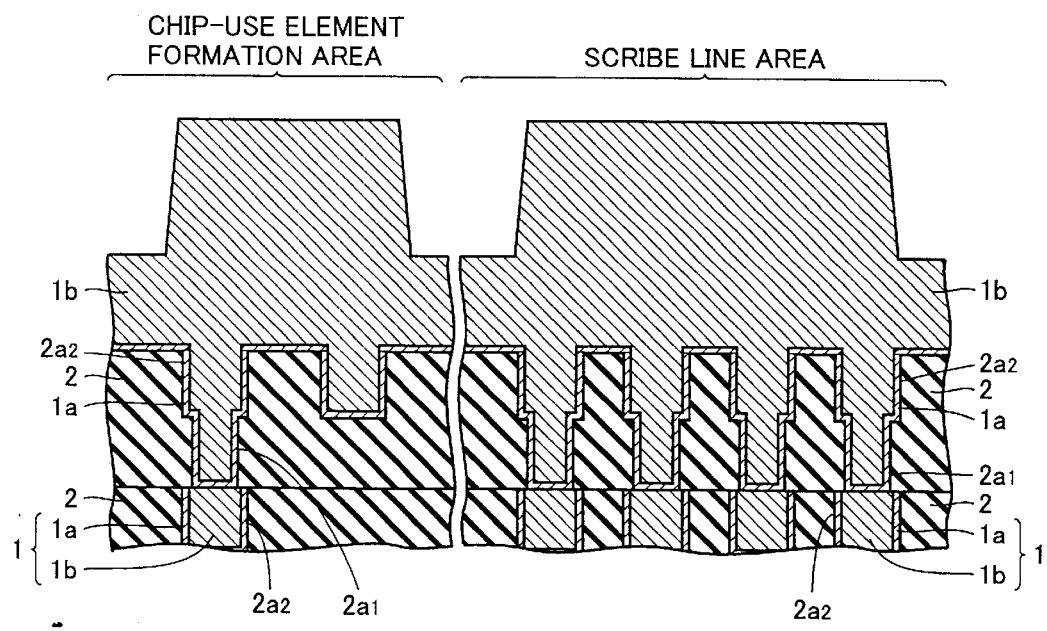
Figure 27:
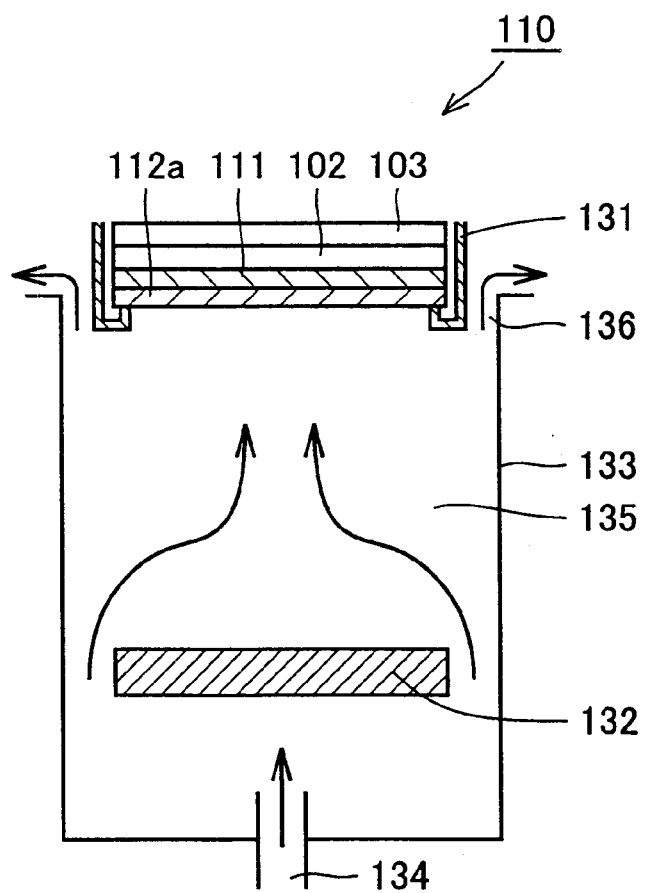
FIG. 27 is a drawing that explains a process of electrolytic plating.

Referring to FIG. 4, an electrolytic plating process is carried out in a plating liquid in a copper sulfate bath by using an electrolytic plating device shown in FIG. 27 so that Cu is deposited in a manner so as to fill the connection hole $2a_1$ and the wiring groove $2a_2$, thereby forming the Cu film 1b. Thereafter, the Cu film 1b and the barrier metal 1a are abraded and removed by the CMP method until the upper surface of the upper-layer insulating film 2 has been exposed.

Figure 5:
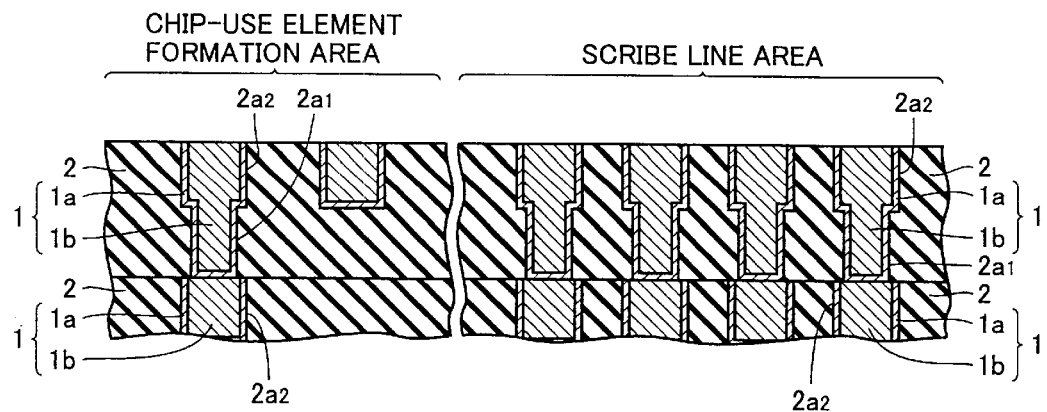

Referring to FIG. 5, by the CMP method, the barrier metal 1a and the Cu film 1b remain only in the connection holes $2a_1$ and the wiring groove $2a_2$, thereby forming a wiring 1. Here, the upper surface of the wiring 1 is virtually flush with the upper surface of the upper-layer insulating film 2.

Figure 6:
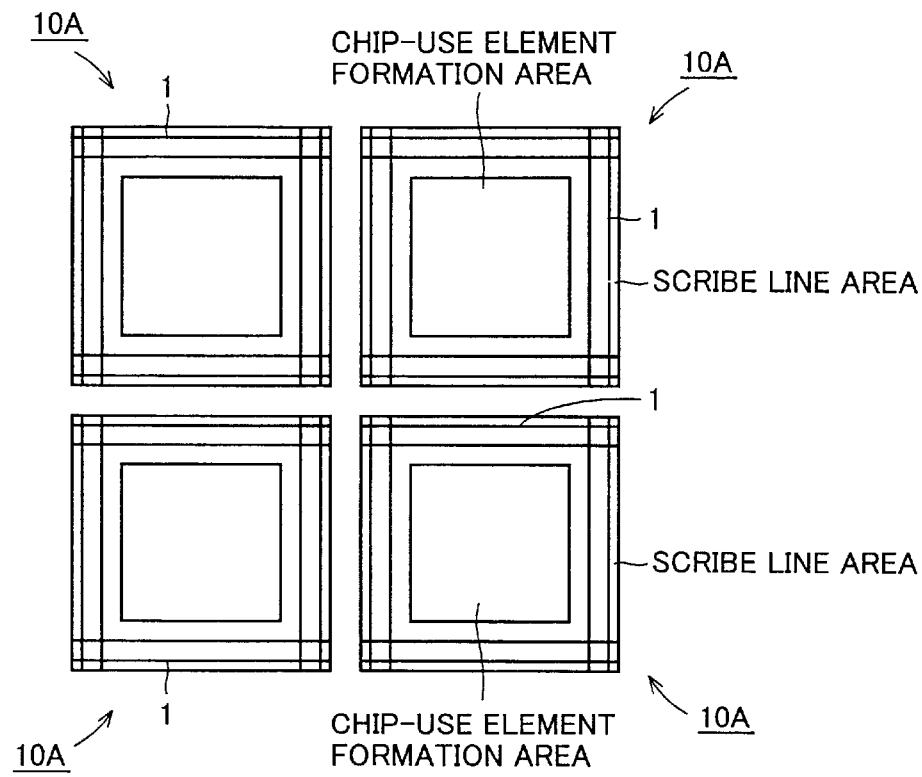
FIG. 6 is a plan view that schematically shows a structure of a chip state of the semiconductor device in the first embodiment of the present invention.

Thereafter, a scribing process is carried out in the scribe line area so that the wafer 10 shown in FIG. 1 is divided into a plurality of semiconductor chips 10A, as shown in FIG. 6.

Referring to FIG. 6, each semiconductor chip 10A has a chip-use element formation area having circuit elements and a scribe line area surrounding the chip-use element formation area. A interconnection 1 is formed in the scribe line area. This interconnection 1 surrounds the scribe line area, and also reaches the end edge of the chip. In other words, the interconnection 1 extends from the end edge of one side to the end edge of the other side, with the two sides forming the opposite sides of the chip 10A.

In the embodiment of the present invention, as illustrated in FIG. 1, the interconnection 1 extending to the scribe line area as shown in FIG. 1 is provided; therefore, it is possible to reduce the difference in resistance between the peripheral portion of the contact electrode and the center portion of the wafer 10 at the time of electrolytic plating. Consequently, it is possible to reduce a difference in the deposition rate of plating between the center portion and the peripheral portion of the wafer 10.

The inventors, etc. of the present invention carried out examinations on the difference in the deposition rate.

Referring to FIG. 3, a TaN film was formed with a thickness of 50 nm on a substrate as the barrier metal 1a, and on this was formed a Cu film with a thickness of 150 nm as a seed layer $1b_1$ for a plated film. Moreover, as illustrated in FIG. 4, the connection hole $2a_1$ and the wiring groove $2a_2$ were filled in with the Cu film from SiO$_2$ surface 1b by electrolytic plating. At this time, the height of a raised Cu film is shown in Table 1. Besides this, Table 1 also shows the results of a case in which electrolytic plating was carried out on a conventional structure.

Here, the evaluated pattern was a wiring pattern formed in the chip, and the width of the interconnection 1 was set to 0.6 μm, the interval between the interconnections 1 was set to 0.6 μm, the depth of the wiring groove $2a_2$ was set to 0.8 μm, and the thickness of the plated Cu film was 200 nm when converted into a solid film.

TABLE 1

| | Height of a raised Cu film | |
|---|---|---|
| | Peripheral portion | Center portion |
| Conventional structure | 880 nm | −210 nm |
| Present embodiment | 590 nm | 70 nm |

The results of Table. 1 show that the formation of the interconnection 1 in the scribe line area enables to reduce the difference in the deposition rate of plating between the center portion and the peripheral portion of the wafer 10.

Figure 7:
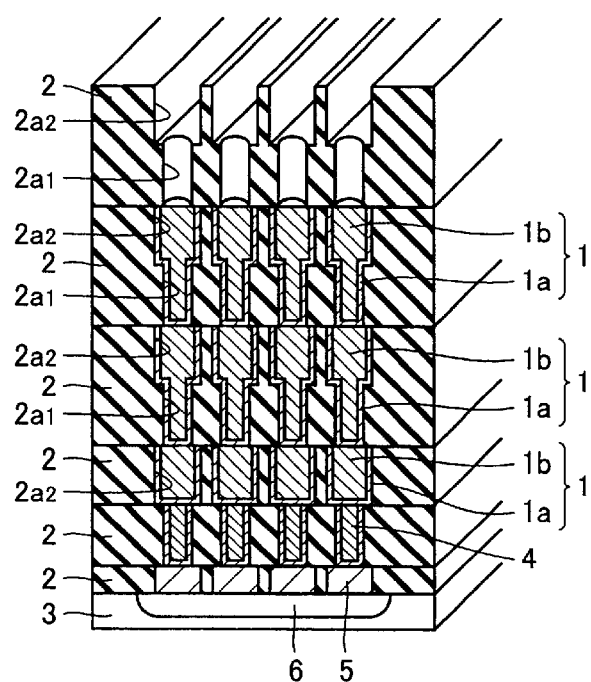
FIG. 7 is a partial cross-sectional perspective view that shows another structure in a scribe section of a semiconductor device in the first embodiment of the present invention.

Here, in the present embodiment, as illustrated in FIG. 2, an explanation has been given of a case in which only the interconnections 1 are laminated; however, as illustrated in FIG. 7, these may be electrically connected to a salicide 5 and an impurity dispersion layer 6 formed on the surface of the semiconductor substrate 3, through a tungsten plug 4, and laminated; thus, it becomes possible to further improve the effect of the resistance reduction.

Figure 8:
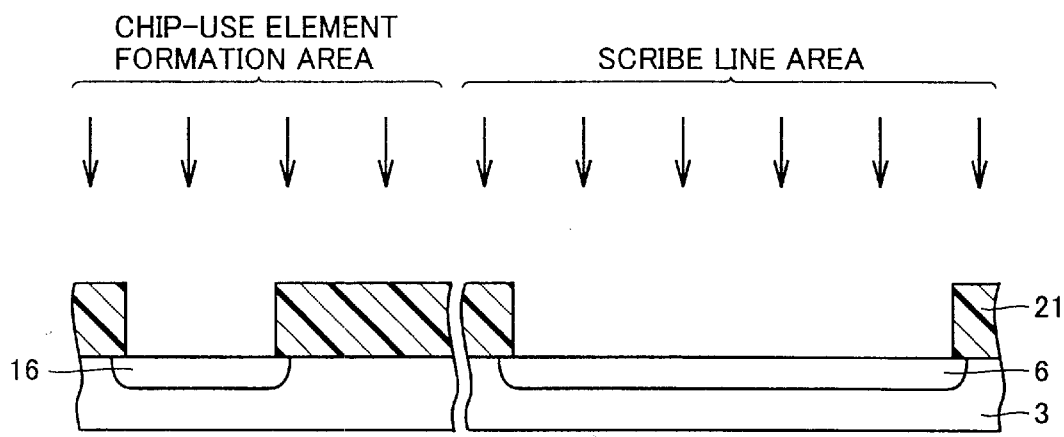
FIG. 8 is a schematic cross-sectional view that explains a manufacturing method of the structure of FIG. 7.

Moreover, the impurity dispersion area 6, shown in FIG. 7, is preferably formed by the same ion injection process as that of an doping area 16 within the chip-use element formation area as illustrated in FIG. 8. In this case, the ion injection is carried out in a state where, for example, a resist pattern 21 is formed on the semiconductor substrate 3 as a mask. Thus, it becomes possible to simplify the manufacturing process.

(Second Embodiment)

Figure 9:
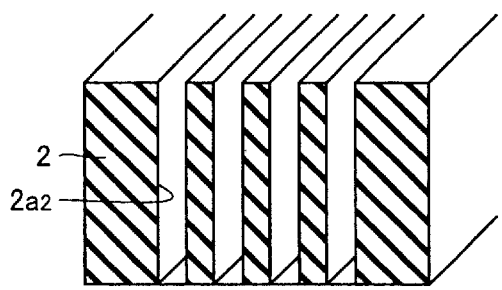
FIG. 9 is a partial cross-sectional perspective view that schematically shows the structure of a scribe section of a semiconductor device in a second embodiment.

In the first embodiment, an explanation has been given of an example in which the upper and lower interconnections 1 are mutually connected through the connection hole $2a_1$. Alternatively, the wiring groove $2a_2$ itself is allowed to penetrate from the upper surface to the lower surface of the insulating film so that the upper and lower interconnections 1 are mutually connected; thus, it becomes possible to further improve the effect of the resistance reduction. Referring to FIG. 9, this structure will be discussed as the second embodiment.

Referring to FIG. 9, in the structure of the present embodiment, the wiring groove $2a_2$ is formed in a manner so as to reach the lower surface from the upper surface of the insulating film 2. A interconnection, constituted by, for example, a barrier metal and a Cu film, is formed so as to be filled in the wiring groove $2a_2$.

The width of the interconnection formed in the wiring groove $2a_2$ is, for example, 0.4 μm, the interval between the wiring grooves $2a_2$ is, for example, 0.4 μm, and the depth of the wiring groove $2a_2$ is, for example, 1.4 μm. Here, in FIG. 9, the interconnections are omitted from the drawing so as to clearly indicate the shape of the wiring grooves $2a_2$.

Here, since the other structures except these are virtually the same as the structures of the first embodiment, the description thereof is omitted.

In the same manner as the first embodiment, the inventors, etc., of the present invention formed a three-layered wiring layer having a structure as shown in FIG. 9, and examined the height of a raised Cu film in the case when the wiring groove $2a_2$ in the fourth layer was filled with a Cu film by electrolytic plating. Table 2 shows the results.

TABLE 2

Height of a raised Cu film

|  | Peripheral portion | Center portion |
| --- | --- | --- |
| Conventional structure | 880 nm | −210 nm |
| Present embodiment | 470 nm | 130 nm |

The results of Table. 2 show that the formation of the interconnection in the scribe line area enables to reduce the difference in the deposition rate of plating between the center portion and the peripheral portion of the wafer 10.

(Third Embodiment)

Figure 10:
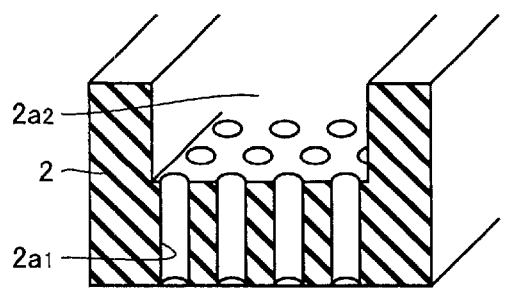
FIG. 10 is a partial cross-sectional perspective view that schematically shows the structure of a scribe section of a semiconductor device in a third embodiment.

In the first and second embodiments, explanations have been given of cases in which interconnections having a narrow width are used as the interconnections 1; however, by increasing the width of interconnections, it becomes possible to further improve the effect of the resistance reduction. Referring to FIG. 10, this structure will be discussed as the third embodiment.

Referring to FIG. 10, in the structure of the present embodiment, a wide wiring groove $2a_2$ is formed in the insulating film 2, and a plurality of connection holes $2a_1$ are formed below the wiring groove $2a_2$. A interconnection, constituted by, for example, a barrier metal and a Cu film, is formed so as to filled into the connection holes $2a_1$ and the wiring groove $2a_2$.

The width of the wiring groove $2a_2$ is, for example, 40 μm, the depth of the wiring groove $2a_2$ is, for example, 0.8 μm, and the interval between the wiring grooves $2a_2$ is, for example, 5 μm. Moreover, the aperture diameter of the connection hole $2a_1$ is, for example, 0.3 μm, the depth of the connection holes $2a_1$ is, for example, 0.6 μm, and the interval between the connection holes $2a_1$ is, for example, 0.7 μm.

In FIG. 10, the interconnections are omitted from the drawing so as to clarify the structures of the wiring groove $2a_2$ and the connection hole $2a_1$.

Here, since the structures other than these are virtually the same as the structures of the first embodiment, the description thereof is omitted.

In the same manner as the first embodiment, the inventors, etc., of the present invention formed a three-layered wiring layer having a structure as shown in FIG. 10, and examined the height of a raised Cu film in the case when the wiring groove $2a_2$ and connection holes $2a_1$ in the fourth layer is filled with a Cu film by electrolytic plating. Table 3 shows the results.

TABLE 3

Height of a raised Cu film

|  | Peripheral portion | Center portion |
| --- | --- | --- |
| Conventional structure | 880 nm | −210 nm |
| Present embodiment | 380 nm | 230 nm |

The results of Table. 3 show that the formation of the interconnection in the scribe line area enables to reduce the difference in the deposition rate of plating between the center portion and the peripheral portion of the wafer 10.

Figure 11:
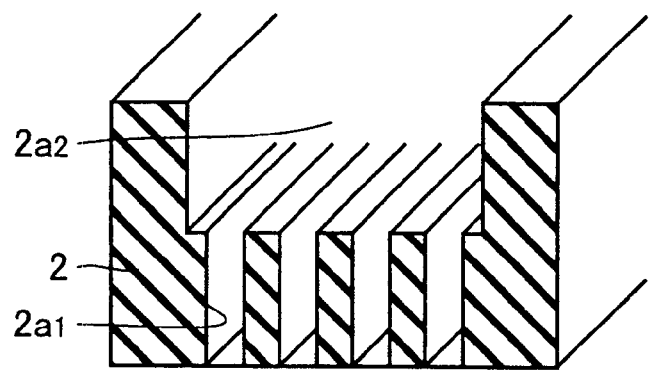
FIG. 11 is a partial cross-sectional perspective view that schematically shows another structure of a scribe section of a semiconductor device in the third embodiment.

Here, in the structure of FIG. 10, an explanation has been given of a case in which holes are used as the connection holes $2a_1$; however, as illustrated in FIG. 11, by using a connecting groove $2a_1$ that extends in the length direction of the interconnection as illustrated in FIG. 11, it becomes possible to further improve the effect of the resistance reduction.

(Fourth Embodiment)

Figure 12:
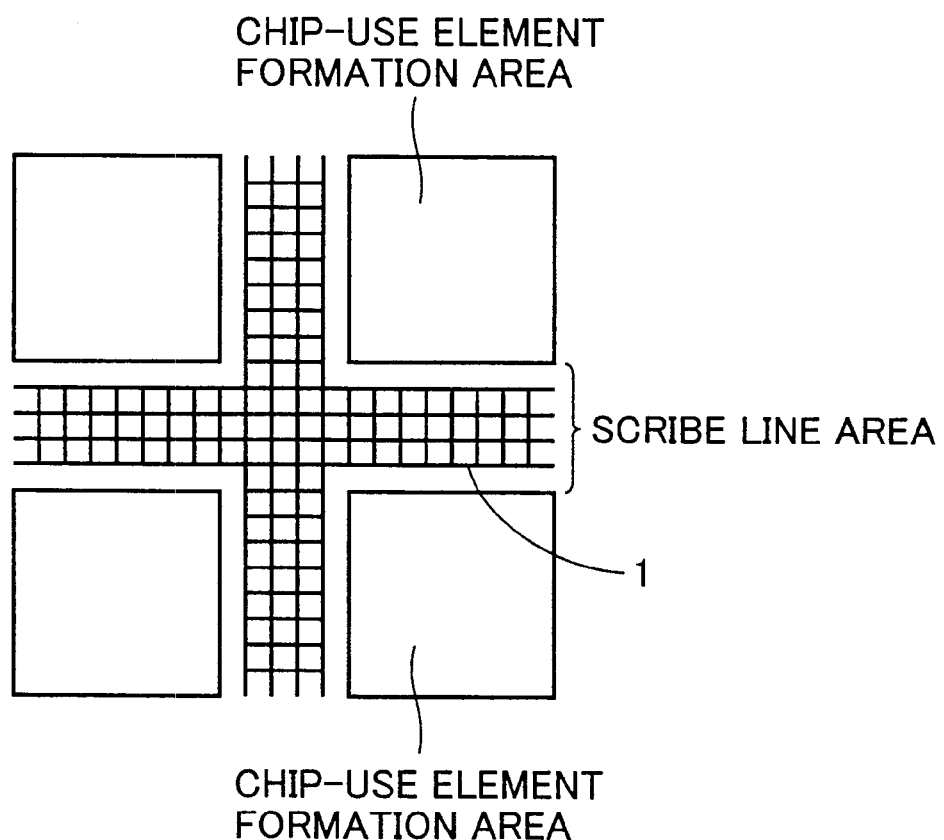
FIG. 12 is a plan view that schematically shows a structure of a wafer state in a semiconductor device in accordance with a fourth embodiment of the present invention.
Figure 13:
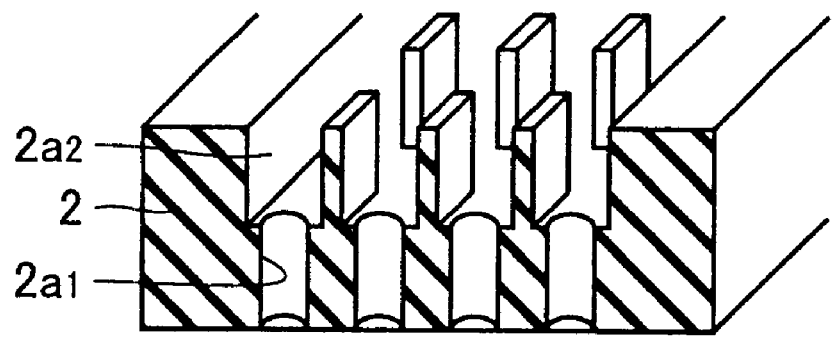
FIG. 13 is a partial cross-sectional perspective view that schematically shows a structure in a scribe line area of the semiconductor device of the fourth embodiment of the present invention.

In the first to third embodiments, explanations have been given of cases in which a plurality of interconnections are arranged in the width direction; however, the interconnections may be connected to each other in the form of a grid so that the effect of the resistance reduction is further improved. Referring to FIGS. 12 and 13, this structure will be discussed as the fourth embodiment.

Referring to FIGS. 12 and 13, the interconnections 1 are extended through the scribe line area while mutually connected to one another in the form of a grid. The interconnections 1 in the form of a grid are filled in into the wiring grooves $2a_2$, and electrically connected to the lower-layer interconnection through the connection holes $2a_1$ located below the wiring grooves $2a_2$.

The size of the chip-use formation area is, for example, 1 cm×1 cm, the width of the scribe line area is, for example, 500 μm, the width of each of the interconnections 1 connected in the form of a grid is, for example, 0.4 μm, the interval between the interconnections 1 is 0.4 μm, the depth of the wiring groove $2a_2$ is, for example, 0.8 μm, the aperture diameter of the connection hole $2a_1$ is, for example, 0.3 μm, the depth of the connection holes $2a_1$ is, for example, 0.6 μm, and the interval between the connection holes $2a_1$ in the wiring direction is, for example, 0.7 μm.

Here, since the other structures except these are virtually the same as the structures of the first embodiment, the description thereof is omitted.

In the same manner as the first embodiment, the inventors, etc., of the present invention formed a three-layered wiring layer having a structure as shown in FIGS. 12 and 13, and examined the height of a raised Cu film in the case when the wiring groove $2a_2$ and connection holes $2a_1$ in the fourth layer was filled with a Cu film by electrolytic plating. Table 4 shows the results.

TABLE 4

Height of a raised Cu film

|  | Peripheral portion | Center portion |
| --- | --- | --- |
| Conventional structure | 880 nm | −210 nm |
| Present embodiment | 430 nm | 190 nm |

The results of Table. 4 show that the formation of the interconnection in the scribe line area enables to reduce the difference in the deposition rate of plating between the center portion and the peripheral portion of the wafer 10.

Figure 14:
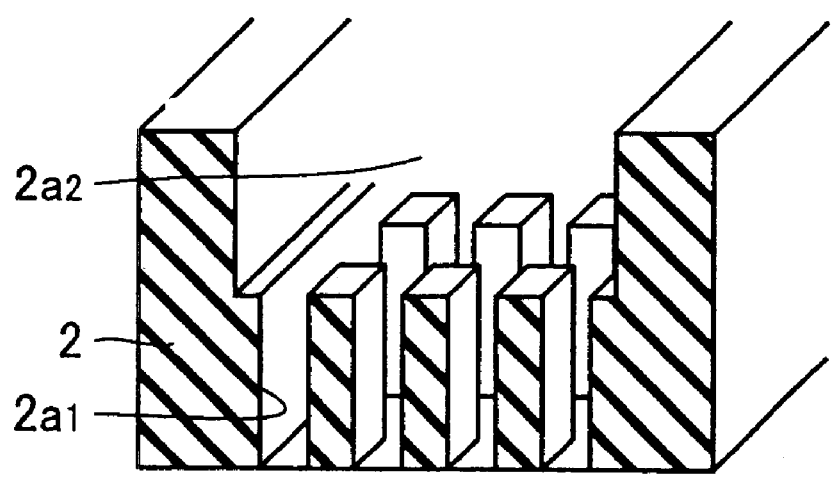
FIG. 14 is a partial cross-sectional perspective view that schematically shows another structure in the scribe line area of the semiconductor device of the fourth embodiment.

Here, in the present embodiment, an explanation has been given of a case in which the wiring grooves $2a_2$ are arranged in the form of a grid; however, as illustrated in FIG. 14, the connection holes $2a_1$ may be arranged in the form of a grid. In this case, in comparison with the case in which the wiring grooves $2a_2$ are arranged in the form of a grid, since the connection area to the lower-layer interconnection is made greater, it becomes possible to further improve the effect of the resistance reduction.

Figure 15:
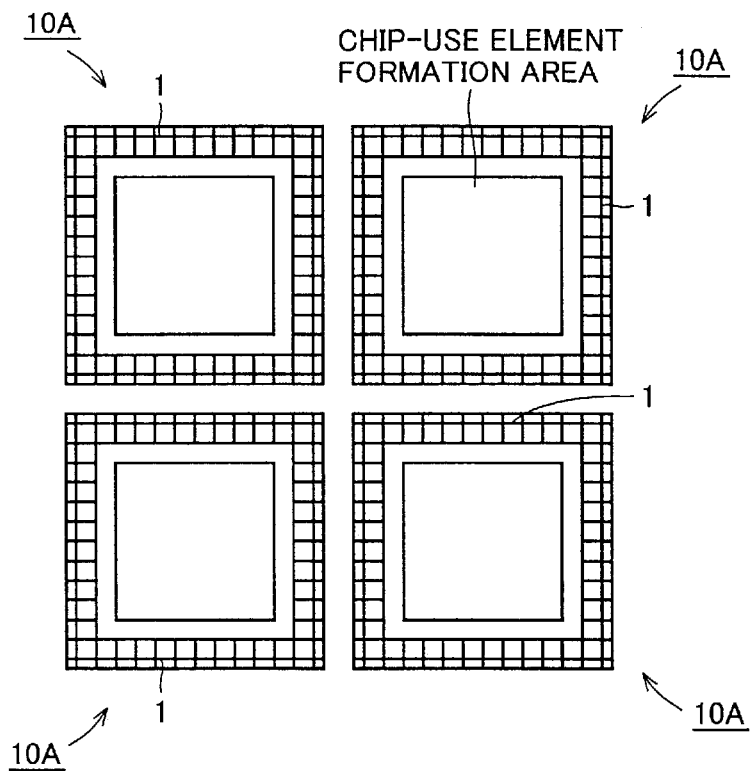
FIG. 15 is a plan view that schematically shows a structure of a chip state of the semiconductor device in the fourth embodiment of the present invention.

Here, a scribing process is carried out in a state shown in FIG. 12 so that the wafer is divided into a plurality of semiconductor chips 10A having a structure as shown in FIG. 15.

(Fifth Embodiment)

Figure 16:
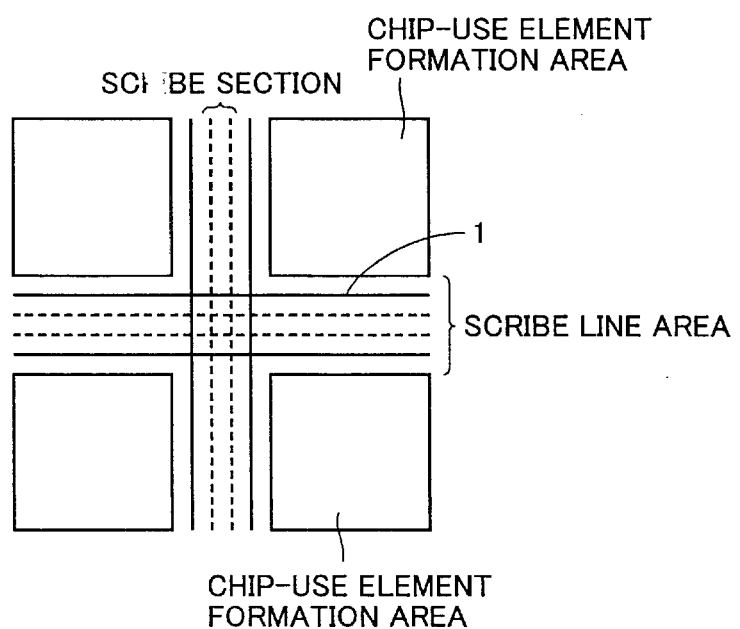
FIG. 16 is a plan view that schematically shows a structure of a wafer state in a semiconductor device in accordance with a fifth embodiment of the present invention.

Referring to FIG. 16, the interconnection 1 to be placed in the scribe line area is preferably set so as not to be located at a section (scribe section) to be cut at the time of scribing. This is because, since the wiring material has elasticity, the existence of the interconnection 1 in the scribe section causes an insufficient scribing process.

Here, since the structures other than these are virtually the same as the structures of the first embodiment, the description thereof is omitted.

(Sixth Embodiment)

Figure 17:
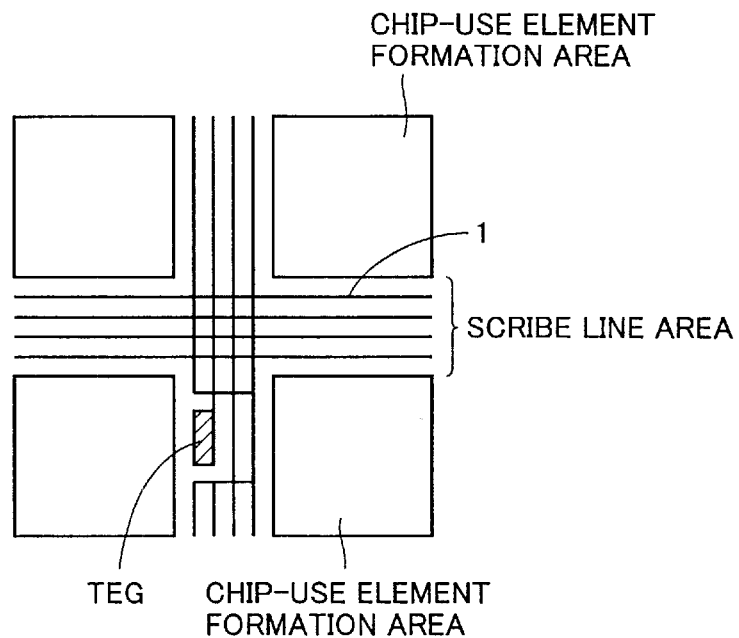
FIG. 17 is a plan view that schematically shows a structure of a wafer state in a semiconductor device in accordance with a sixth embodiment of the present invention.

Referring to FIG. 17, in some cases, a test element group (TEG) for testing characteristics of a circuit element, etc., within the chip-use element formation area is formed in the scribe line area, and in this case, the interconnections 1 are formed in a manner so as to avoid the TEG.

Here, since the structures other than these are virtually the same as the structures of the first embodiment, the description thereof is omitted.

Figure 18:
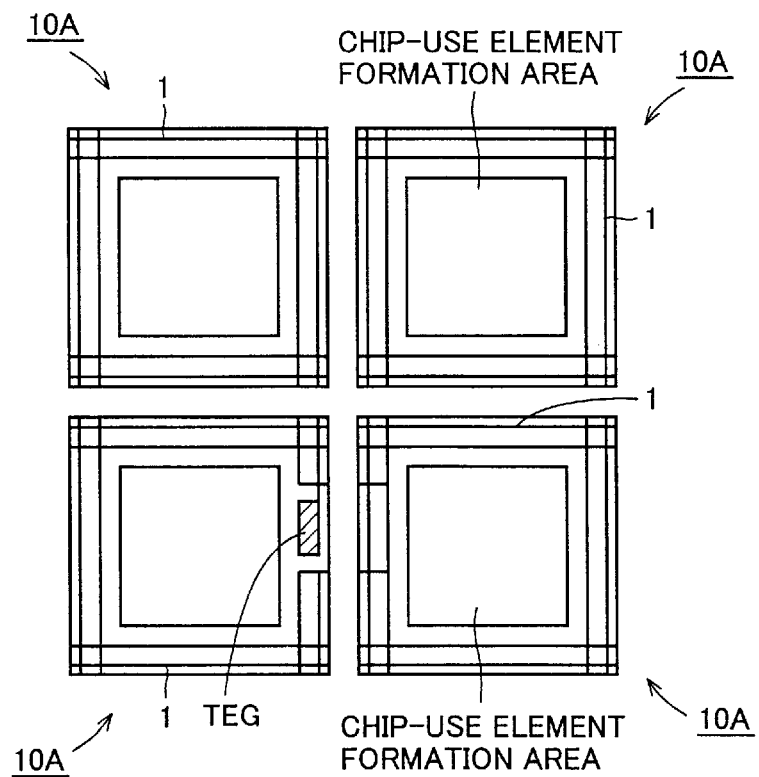
FIG. 18 is a plan view that schematically shows a structure of a chip state of the semiconductor device in the sixth embodiment of the present invention.

A scribing process is carried out in a state shown in FIG. 17 so that the wafer shown in FIG. 17 is divided into a plurality of semiconductor chips 10A, as shown in FIG. 18.

Figure 19:
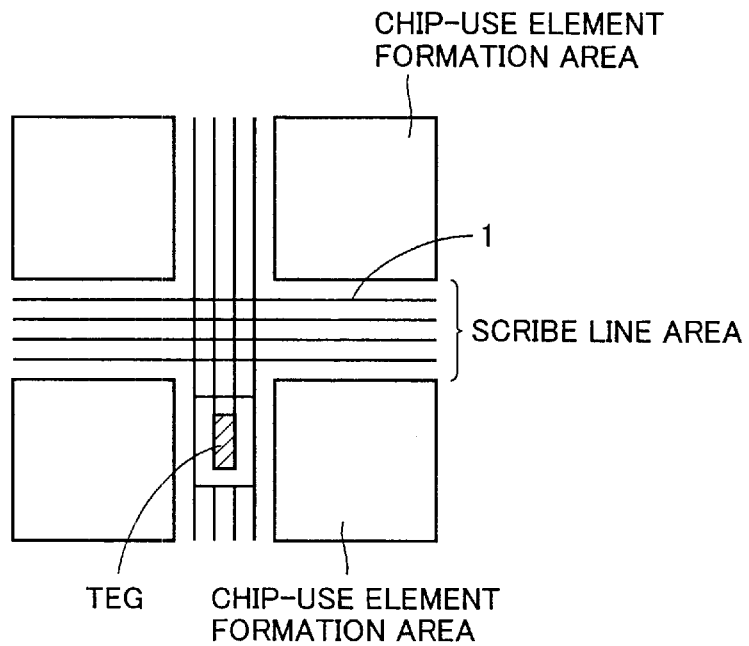
FIG. 19 is a plan view that schematically shows another structure of a wafer state in the semiconductor device in accordance with the sixth embodiment of the present invention.
Figure 20:
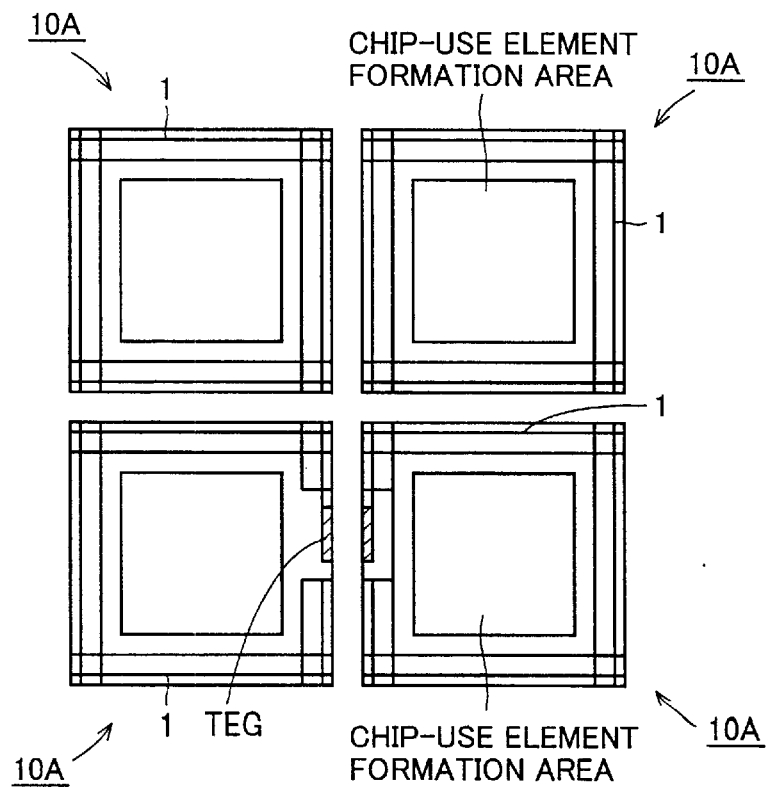
FIG. 20 is a plan view that schematically shows another structure of a chip state in the semiconductor device in accordance with the sixth embodiment of the present invention.

Moreover, the position of the TEG is not intended to be limited by the position shown in FIG. 17, and may be placed in various positions within the scribe line area. For example, the TEG may be placed at an area (scribe section) to be cut at the time of scribing as shown in FIG. 19. By carrying out the scribing process in a state as shown in FIG. 19, the wafer is divided into a plurality of semiconductor chips 10A having a structure shown in FIG. 20.

(Seventh Embodiment)

Figure 21:
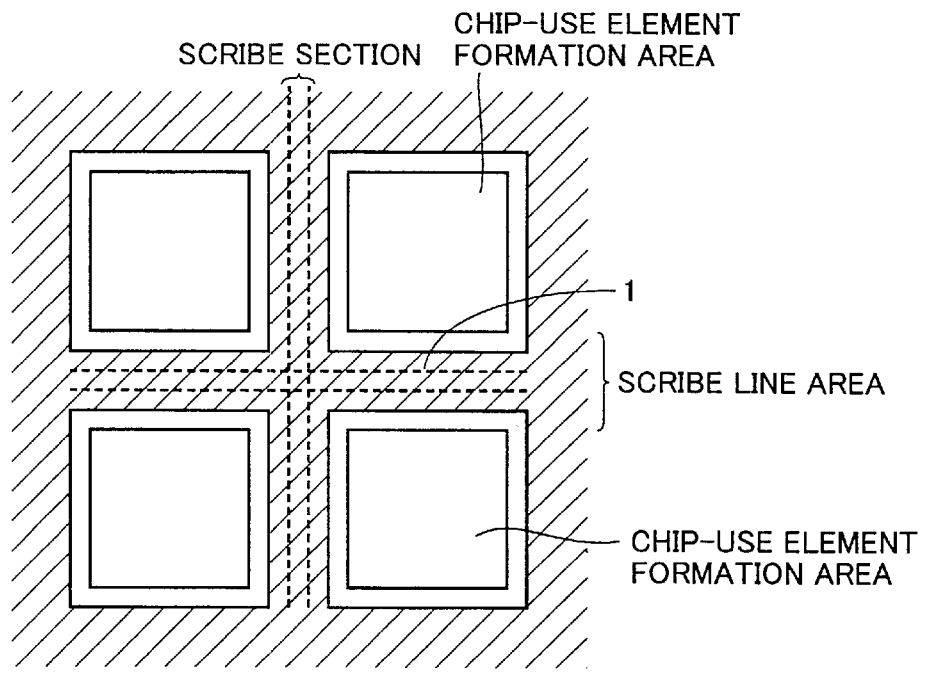
FIG. 21 is a plan view that schematically shows a structure of a wafer state in a semiconductor device in accordance with a seventh embodiment of the present invention.

Referring to FIG. 21, the interconnection 1 to be placed in the scribe line area may have a width greater than a width of a cut margin (scribe section) at the time of scribing. In this case, since the width of the interconnection 1 can be made greater, it becomes possible to further improve the effect of the resistance reduction.

Here, since the structures other than these are virtually the same as the structures of the first embodiment, the description thereof is omitted.

Figure 22:
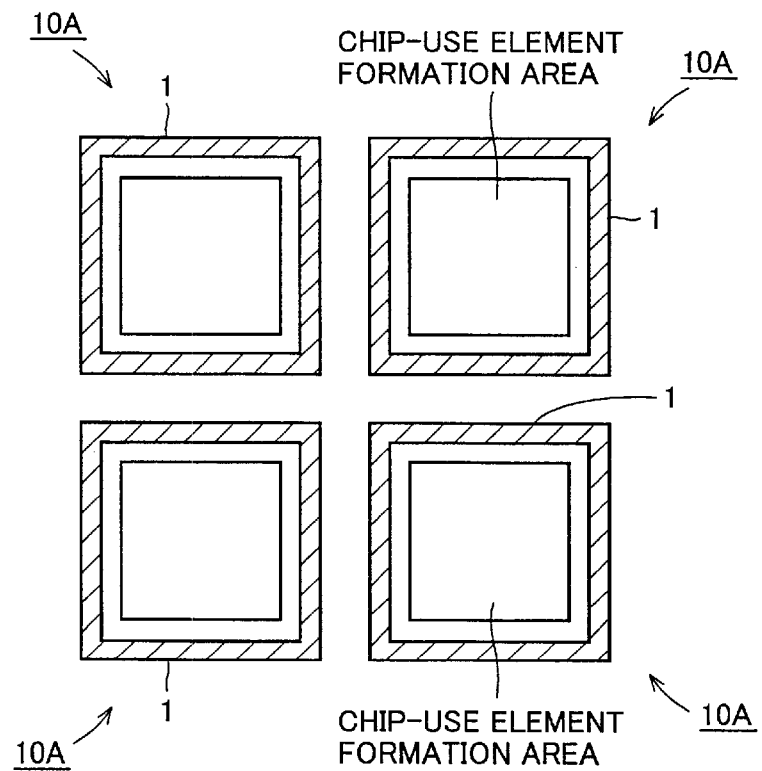
FIG. 22 is a plan view that schematically shows a structure of a chip state in the semiconductor device in accordance with the seventh embodiment of the present invention.
Figure 23:
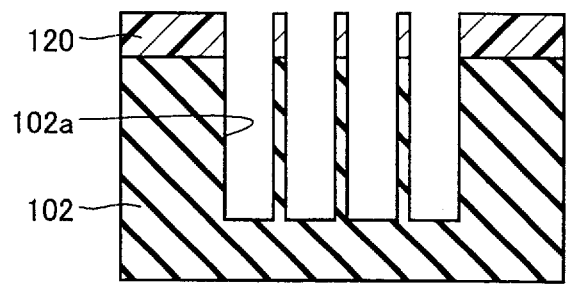
FIGS. 23, 24, 25, and 26 are schematic cross-sectional views that show a sequence of processes of a conventional manufacturing method of a semiconductor device.
Figure 24:
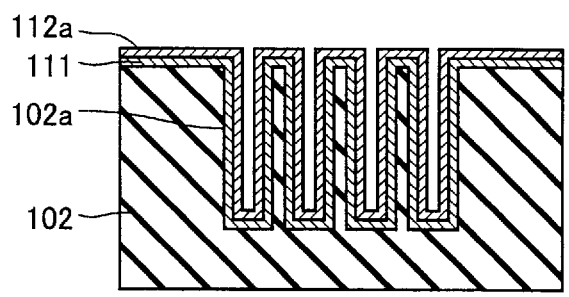
Figure 25:
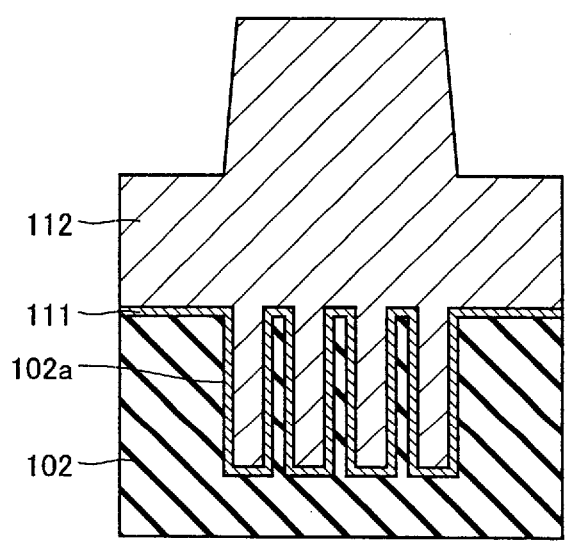
Figure 26:
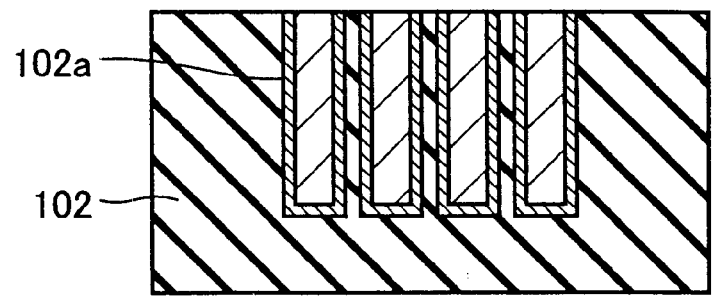

When a scribing process is carried out from the state shown in FIG. 21, the interconnection 1 is formed on the entire periphery of the end edge of the chip 10A, as shown in FIG. 22.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising
   a semiconductor wafer including:
      a plurality of chip formation areas, each chip formation area having a plated conductive layer, wherein at least a first chip formation area and a second chip formation area are successively adjacent to each other and lie along a straight line in a first direction;
      a scribe line area separating said plurality of chip formation areas from each other; and
      an interconnection in said scribe line area, not entering said chip formation areas, and extending to near an edge of said wafer, wherein at least part of said interconnection extends alongside said first and second chip formation areas in the first direction.

2. The semiconductor device according to claim 1, further comprising an impurity area in said scribe line area at a main surface of said semiconductor wafer, said interconnection being electrically connected to said impurity area.

3. The semiconductor device according to claim 1, wherein said interconnection surrounds at least one of said chip formation areas.

4. The semiconductor device according to claim 1, including a test element for testing characteristics of an element within said chip formation area, and located in said scribe line area.

5. The semiconductor device according to claim 1, wherein said interconnection is wider than a cutting margin of a scribe used to divide said wafer into chips.

6. The semiconductor device according to claim 1, including a plurality of said interconnections laminated in a thickness direction and electrically connected to one another.

7. A semiconductor comprising
   a semiconductor chip produced by scribing and breaking a semiconductor wafer along scribe lines defining side surfaces of said semiconductor chip, said semiconductor chip including:
      a chip formation area having a plated conductive layer;
      a remaining scribe line area remaining after scribing and breaking the semiconductor wafer, said remaining scribe line area surrounding said chip formation area; and
      interconnections in said remaining scribe line area surrounding but not entering said chip formation area, and reaching an edge of said semiconductor chip.

8. The semiconductor device according to claim 7, including a test element for testing characteristics of an element within said chip formation area, and located in said scribe line area.

9. The semiconductor device according to claim 7, including a plurality of said interconnections laminated in a thickness direction and electrically connected to one another.

10. The semiconductor device according to claim 7, further comprising an impurity area in said remaining scribe line area at a main surface of said semiconductor chip, said interconnection being electrically connected to said impurity area.

* * * * *